United States Patent
Litman et al.

(10) Patent No.: US 6,914,443 B2
(45) Date of Patent: Jul. 5, 2005

(54) APPARATUS AND METHOD FOR ENHANCED VOLTAGE CONTRAST ANALYSIS

(75) Inventors: Alon Litman, Nes-Ziona (IL); Chris Talbot, Emerald Hills, CA (US)

(73) Assignee: Applied Materials Israel, Ltd., Rehovot (IL)

( * ) Notice: Subject to any disclaimer, the term of this patent is extended or adjusted under 35 U.S.C. 154(b) by 0 days.

(21) Appl. No.: 10/426,205

(22) Filed: Apr. 29, 2003

(65) Prior Publication Data

US 2004/0017212 A1 Jan. 29, 2004

Related U.S. Application Data

(60) Provisional application No. 60/397,777, filed on Jul. 24, 2002.

(51) Int. Cl.⁷ ............................................. G01R 31/305
(52) U.S. Cl. ....................................... 324/751; 324/752
(58) Field of Search ................................ 324/750–754, 324/763, 765, 158.1; 250/307, 310–311, 306, 492.21; 356/401

(56) References Cited

U.S. PATENT DOCUMENTS

| | | | | |
|---|---|---|---|---|
| 3,796,947 A | * | 3/1974 | Harrod et al. | 324/501 |
| 4,417,203 A | * | 11/1983 | Pfeiffer et al. | 324/501 |
| 4,837,506 A | * | 6/1989 | Patterson | 324/752 |
| 5,523,694 A | * | 6/1996 | Cole, Jr. | 324/751 |
| 5,959,459 A | | 9/1999 | Satya et al. | |
| 6,320,396 B1 | * | 11/2001 | Nikawa | 324/751 |
| 6,445,199 B1 | | 9/2002 | Satya et al. | |
| 6,448,099 B1 | | 9/2002 | Iacoponi et al. | |
| 6,449,749 B1 | | 9/2002 | Stine | |
| 6,475,871 B1 | | 11/2002 | Stine et al. | |

* cited by examiner

*Primary Examiner*—Minh N. Tang
(74) *Attorney, Agent, or Firm*—McDermott, Will & Emery

(57) ABSTRACT

A system and method is provided for testing the resistance of a test wafer having multiple conductors. Embodiments include a method having the steps of providing a signal that is substantially larger than a signal threshold to a test structure; and scanning at least two conductors of the test structure, that are electrically couplet to each other, by a limited voltage resolution SEM. Charged particles emitted from the at least two conductors as a result of the scanning are collected, thus providing an indication about a resistance of the at least two conductors.

72 Claims, 7 Drawing Sheets

APPARATUS AND METHOD FOR ENHANCED VOLTAGE CONTRAST ANALYSIS

This application claims the benefit of Provisional Application No. 60/397,777, filed Jul. 24, 2002.

FIELD OF THE INVENTION

This invention relates to apparatus and method for testing and yield analysis wafer test structures and in particular for testing and yield analysis of wafer test structures by charged particle microscopes and in particular scanning electron microscopes.

BACKGROUND OF THE INVENTION

Integrated circuits are very complex devices that include multiple layers. Each layer may include conductive material, isolating material and/or semi-conductive materials. These various materials are arranged in patterns, usually in accordance with the expected functionality of the integrated circuit.

Commonly, an integrated circuit includes a substrate, multiple conductive layers (also known as metal layers) and multiple dielectric layers. Conductive layers usually include conductors made of conductive materials, whereas the conductors are separated by isolating or dielectric materials such as various oxides. The dielectric layers are located between the conductive layers in an interlaced manner. Conductors of distinct conductive layers may be connected to each other and/or to the substrate by conductive materials (termed contacts or vias) that pass through the dielectric layers to connect a conductor in one layer to a conductor in an adjacent conductive layer.

Manufacturing failures may affect the electrical characteristics of the integrated circuits. Some of these failures result from unwanted disconnections between various elements of the integrated circuits. These failures are known as "open". Other failures result from unwanted connections between various elements of the integrated circuits. These failures may include unwanted connections between isolated conductors, unwanted connections between a conductor and the ground via the substrate. These failures are also known as "shorts".

A well-known inspection technique is the "voltage contrast technique". This technique usually includes a charging stage and an imaging stage (often combine in a single scan or pass of a charged particle beam). During the charging stage an electron beam can be directed onto a portion of a test structure (sometimes a large sized pad that can be relatively easily located). During the imaging stage an electron beam is scanned across the test pattern whereas voltage potential level of a scanned point is reflected by an intensity and/or an energy level of secondary electrons emitted from said point.

Voltage contrast techniques are described in various publications, including U.S. Pat. No. 6,445,199 of Satya et al., U.S. Pat. No. 6,448,099 of Iacoponi et al., and U.S. Pat. No. 5,959,459 of Satya et el., all three patents are incorporated herein by reference.

Test patterns may be formed on various substrates/objects, such as test wafers and product wafers. Various test structures are described in the above mentioned U.S. patents, and in U.S. Pat. No. 6,475,871 of Stine et al. and in U.S. Pat. No. 6,449,749 of Stine, said U.S. patents are all incorporated herein by reference.

Test wafers aid in integrated circuit manufacturing process monitoring. They are designed and fabricated such that defects and malfunctions that occur during the manufacturing of integrated circuits can be detected and localized when the test wafers are tested and/or inspected.

Scanning electron microscopes are operable to implement voltage contrast techniques. They usually direct a beam of about $10^{-9}$ Amperes towards a specimen to provide charging patterns that are imaged and processed. Each SEM is characterized by a voltage resolution level. Many prior art SEMs (usually those of the fab type SEMs) have a relatively low voltage resolution (typically of 1Volts). Said low voltage resolution SEMs are utilized for detecting opens and shorts.

SUMMARY OF THE INVENTION

The invention provides a system and apparatus for testing the resistance of conductors, particularly defective conductors. The apparatus includes an electrical signal source that provides a signal that is substantially larger than a signal threshold to a test structure; and a low voltage resolution SEM. The limited voltage resolution SEM is operable to (i) scan at least two conductors of the test structure, said at least two conductors are electrically coupled to each other, (ii) collect charged particles emitted from the at least two conductors as a result of the scanning; and (ii) provide an indication about a resistance of the at least two conductors.

The limited voltage resolution SEM includes (i) means for depositing electrical charges such as at least one electron gun and (ii) focusing arrangement that are operable to extract electrons from the electron gun and direct them towards the test wafer. The focusing arrangement may include at least one magnetic and/or electrostatic lenses, condensers, aberration correction means, beam shaping devices and the like, and any combination of them.

The limited voltage resolution SEM may also include means for scanning such as electrical and/or mechanical means that introduce a relative movement between the wafer and the electron beam. The scanning may be implemented by a substantially constant movement along at least one axis, but this is not necessarily so and the scanning may also be implemented by various means, such as by a step and scan mechanism.

The limited voltage resolution SEM includes means for collecting and analyzing the charged particles, and at least one detector operable to detect at least one of various types of particles, such as secondary electrons, backscattered electrons, photons including X-rays and the like, or a combination of at least two of said detectors.

The at least one detector is usually connected to a signal processing device, that processes the signals provided by the detectors to determine the condition of the tested wafer. The process of determining the condition of the tested wafer may implement using comparison of die-to-die, die-to database and/or die-to simulated results or a combination of these techniques.

The invention provides a method for testing the resistance of conductors, the method includes a step of providing to a test structure a signal that is substantially larger than a signal threshold, and step of scanning at least two conductors of the test structure, by a limited voltage resolution SEM, said at least two conductors are electrically coupled to each other, and collecting charged particles emitted from the at least two conductors as a result of the scanning, thus providing an indication about a resistance of the at least two conductors.

The apparatus and method may further include performing a probe-based test, and especially determining the resistance of test structure sections and/or indicating which test structure sections are to be tested by the low resolution SEM. The probe-based test is followed by a step of connecting isolated test structure sections to each other and to a signal supply.

According to an aspect of the invention the system and method are able to test structures on product wafers even though the wafer is scrapped.

BRIEF DESCRIPTION OF THE DRAWINGS

In order to understand the invention and to see how it may be carried out in practice, a preferred embodiment will now be described, by way of non-limiting examples only, with reference to the accompanying drawings, in which.

DETAILED DESCRIPTION OF THE INVENTION

The following description relates to limited voltage resolution charged particle microscopes, such as limited voltage resolution Scanning Electron Microscopes (SEMs), such as step and repeat type limited voltage resolution SEMs, in which a wafer is scanned by repetitive steps of scanning an area of the wafer (said area defined by the field of view of the SEM) and mechanically introducing a movement between the wafer and SEM to facilitate the scanning of another area. Said movement may also be implemented by electrostatic and/or magnetic fields introduced by various electrostatic and/or magnetic elements such as lenses, deflectors and the like. It is noted that other charged particles and even photons may be utilized for detecting voltage contrast. It is further noted that this invention may also be implemented by introducing a substantially constant movement between the SEM and the wafer. The movement may be linear or even rotational, and/or any combination of both movements.

It is further noted that multiple test patterns and multiple scanning paths can be implemented within the scope of the invention. It is further noted that the location, size and density of test patterns may vary on a wafer to wafer basis but even on a die to die basis. A test structure may be sized along one dimension, to fit within a scribe-line; the size along the other dimension may be any.

It is noted that the conductors of each test pattern are shown to be identical; however, in practice they may be different. They could consist of entirely different circuits or of identically patterned circuits but with slightly different features or dimensional parameters. In the latter case, they would be subject to faults under slightly different fabrication process conditions, or may have different probabilities of faults under given conditions—all of which may be utilized for sensitive monitoring of the process. It will be appreciated that the number of circuits in the structure, and consequently the number of pads, may also be different from four—for example, two, six or eight or more.

Figure 1:
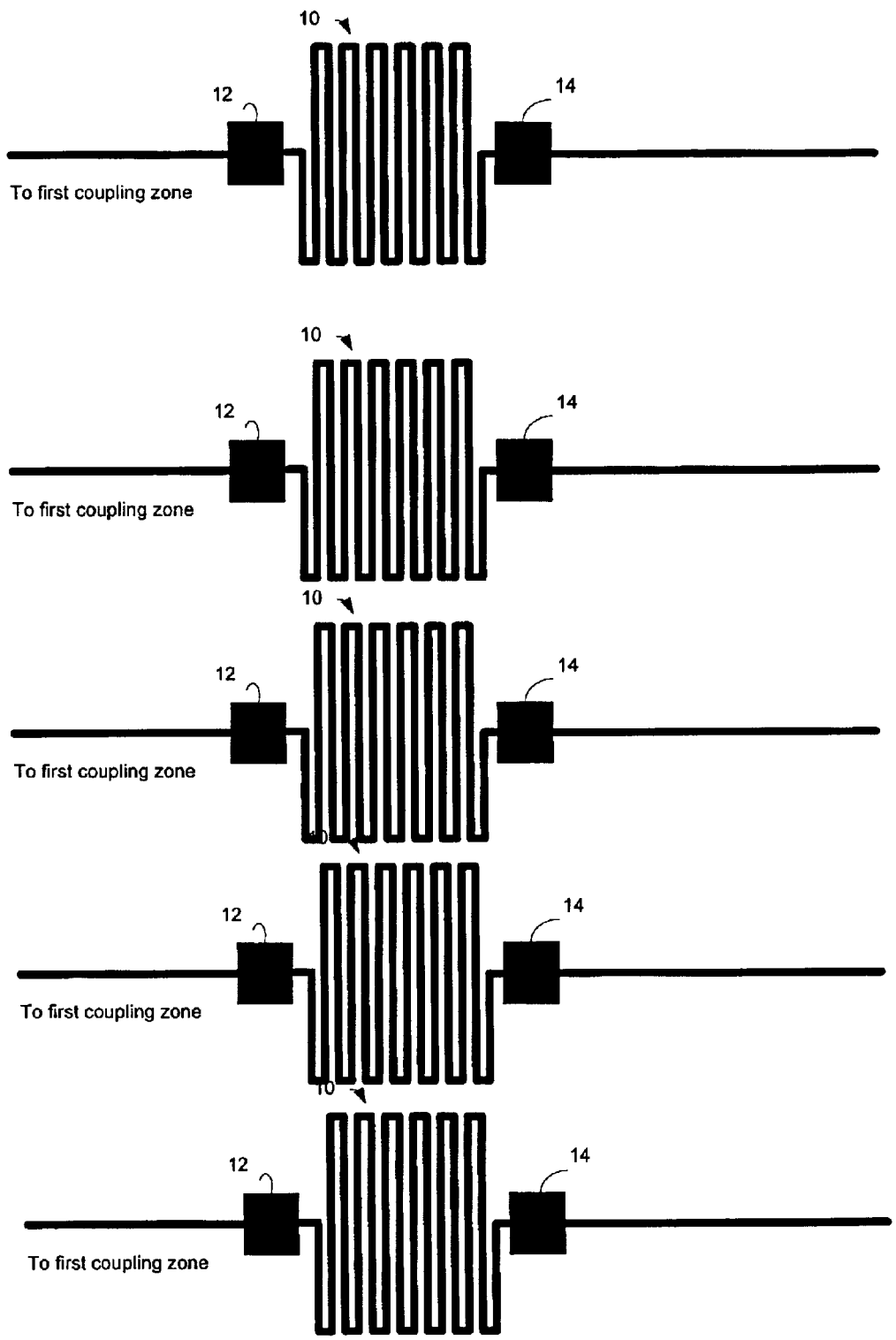
FIGS. 1–3 illustrate multiple serpentine shaped test structure sections, in accordance to various embodiments of the invention.
Figure 2:
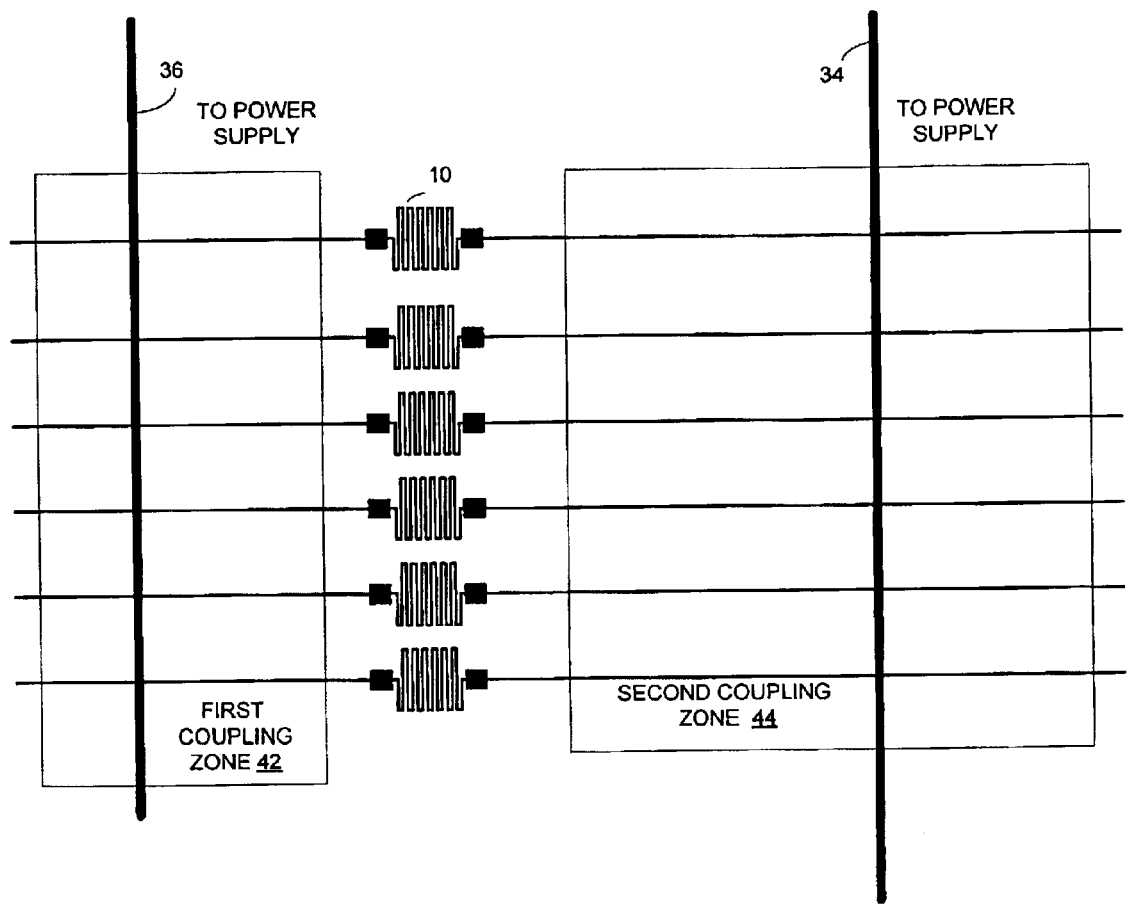
Figure 3:
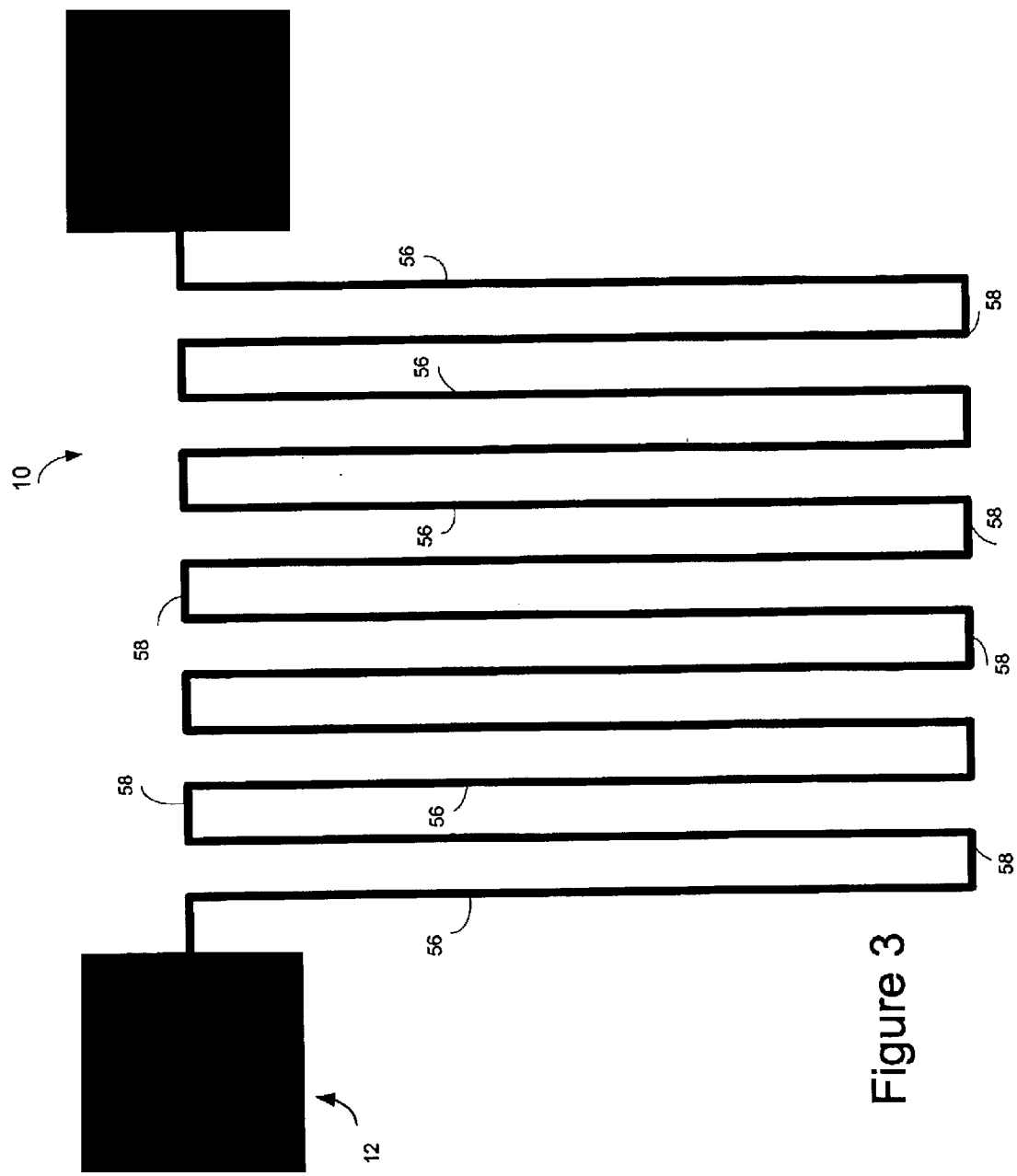

FIGS. 1–3 illustrate multiple serpentine shaped test structure sections 10, each are electrically connected to first and second pads 12 and 14 respectively. Each of first and second pads 12 and 14 are connected to conductors that form in turn first and second coupling zones 42 and 44. Coupling zones 42 and 44 are connected, via conductors 36 and 34 to a voltage or current source (not shown). Each test structure section 10 includes multiple conductors, such as relatively long and often substantially parallel latitudinal conductors 56 that are connected to each other by relatively short longitudinal conductors 58. The conductors may be formed on the same level but are usually formed on distinct levels of the integrated circuit/test wafer and are connected to each other by vias/contacts. It is noted that in many cases each test structure section 10 include at least one thousand conductor elements.

According to one embodiment of the invention the conductors and pads are formed at the same IC layer, whereas they are formed such as to introduce a relatively small gap between them. By using deposition techniques, such as Focused Ion Beam techniques, a conductive material can be deposited such as to electrically connect the pads and conductors.

The serially connected conductors form a voltage divider and a voltage that is proportional to the resistance of each conductor/via is formed upon each conductor when the voltage or current source applies a voltage between conductors 36 and 34. In mathematical terms:

$$V_{i,j} = V_i * \frac{R_{i,j}}{R_i}, \text{ whereas } R_i = \sum_j R_{i,j}$$

$V_{ij}$ and $R_{ij}$ are the voltage of the j'th conductor of the i'th section of the test structure and its resistance respectively, $V_i$ is the voltage applied to the i'th section of the test structure, and $R_i$ is the resistance of the i'th section of the test structure. Note that in the case of a resistive defect such as a high resistance via, the majority of the voltage will be induced across the defect, hence making localization of the defect using voltage contrast techniques, possible.

Assuming that the voltage supply provides a voltage of about 10 Volts, for example, to each test structure section, and assuming that the test structure includes forty five hundred conductors, each having resistance of about 1 Ohm, then a SEM with a voltage resolution of 1 Volt may detect a defective conductor that has a resistance of 500 Ohms.

Figure 4:
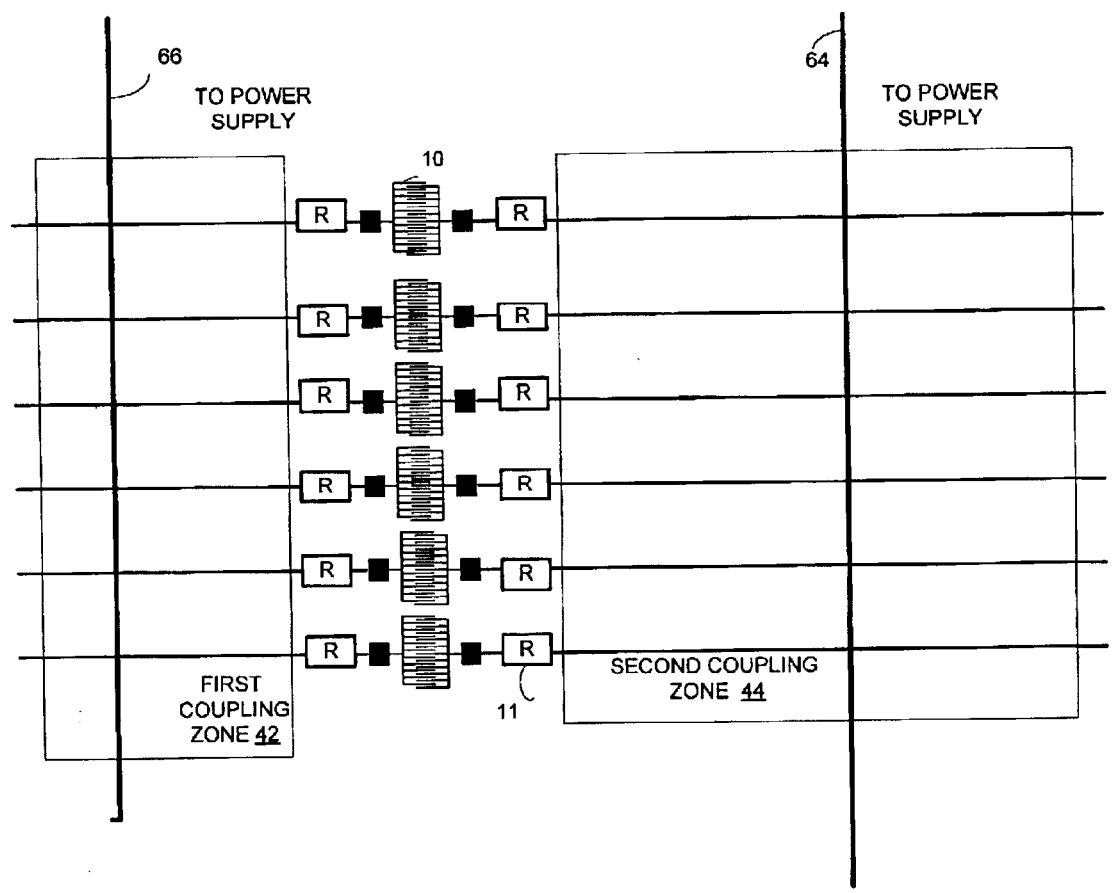
FIG. 4 illustrates multiple comb shaped test structure sections, in accordance to an embodiment of the invention.

FIG. 4 illustrates multiple comb-shaped test structure sections 10 that are coupled to the voltage source via resistors 11. The resistors 11 prevent shorts if two parts of an isolated comb shaped test structure section are connected to each other. It is noted that the signal, voltage or current source can be protected against shorts by adding a resistor in series to either connector 64 or 66 but the placement of resistors 11 in series to each test structure section enables the measurement of test structure sections in the presence of a shortened test structure portion.

Figure 6:
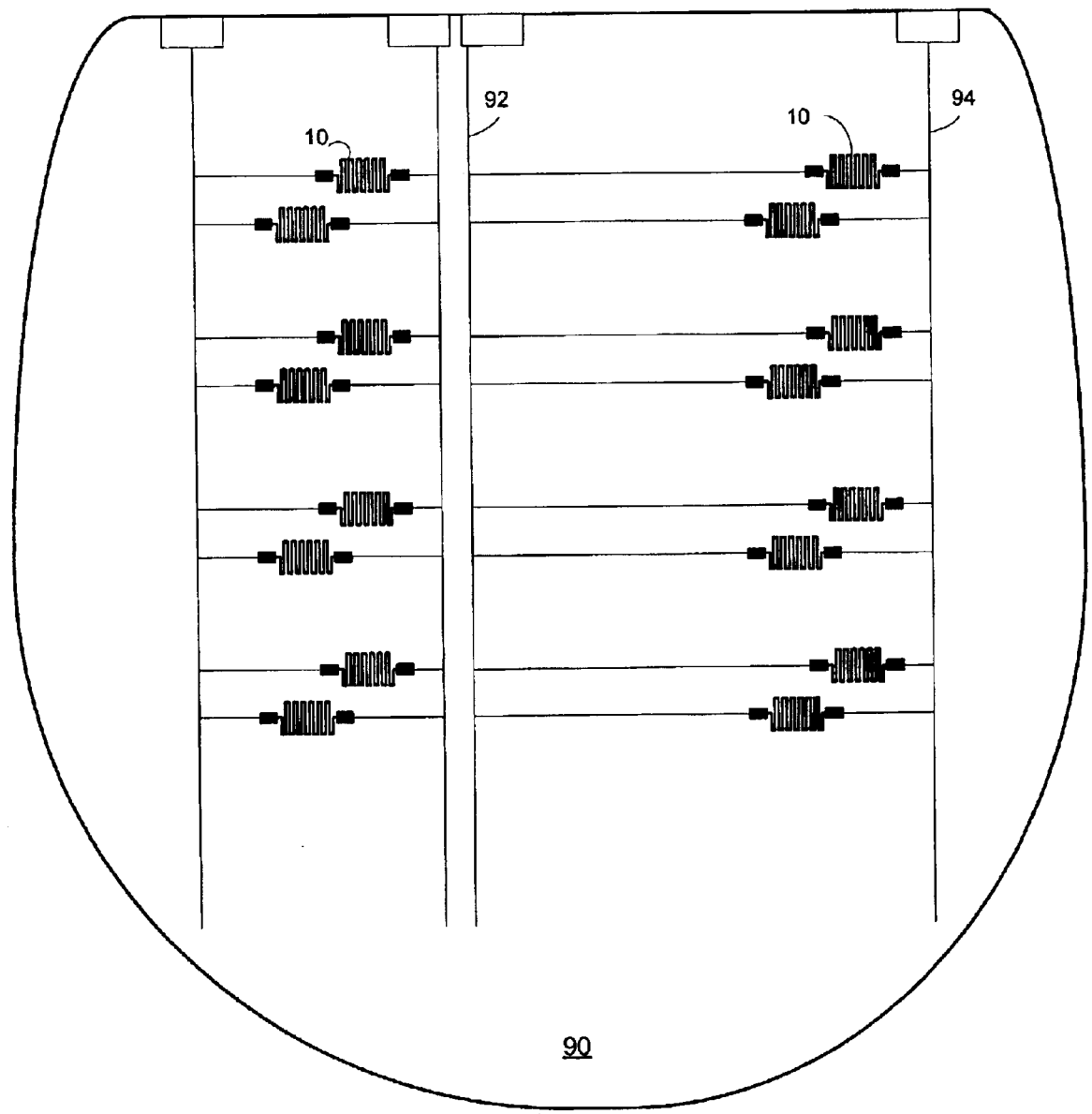
FIG. 6 illustrates a wafer including multiple test structure sections, in accordance to an aspect of the invention.

FIG. 6 illustrates a wafer 90 including multiple test structure sections 10 coupled to conductors such as 92 and 94, to be later coupled to a source.

Figure 5:
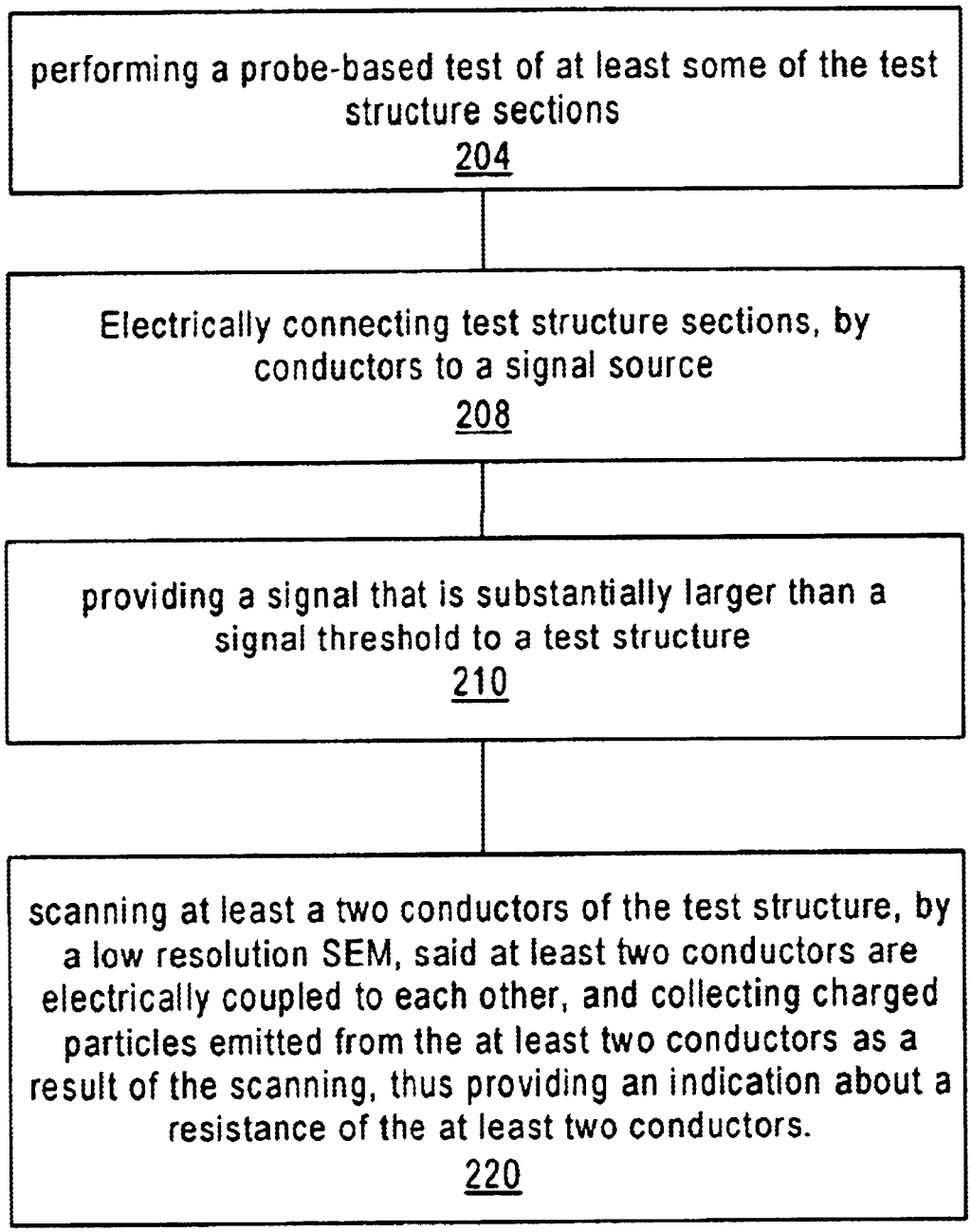
FIG. 5 is a flow chart illustrating a method, in accordance to an aspect of the invention.

FIG. 5 is a flow chart illustrating a method 200, in accordance to an aspect of the invention.

Method 200 starts at step 210 of providing a signal that will induce a voltage on a test structure that is substantially larger than a signal threshold of a SEM to a test structure. The signal is provided by a source, such as a current source or a voltage source via conductors and optionally a resistor chain. According to some aspects of the invention the signal may alternate and various iterations of steps 210 and 220 are performed to provide said indication.

According to various aspects of the invention the signal threshold may be selected between the following thresholds, although other thresholds may be selected: The signal threshold may be selected: (i) $10^{-6}$ Volts, (ii) $10^{-3}$ Volts, (iii) $10^{-7}$ Amperes, (iv) $10^{-4}$ Amperes, (iv) a signal threshold that enables an indication about a resistance of at least two conductors that is characterized by a resolution that does not exceeds one thousand Ohm; (v) a signal threshold that enables an indication about a resistance of the at least two conductors that is characterized by a resolution that does not exceeds ten thousand Ohm; (iv) a signal threshold that is substantially larger than a voltage induced on the test structure by a charged particle beam of a scanning electron microscope.

Step 210 is followed by step 220 of scanning at least a two conductors of the test structure, with a [limited voltage resolution] SEM, said at least two conductors are electrically coupled to each other, and collecting charged particles emitted from the at least two conductors as a result of the scanning, thus providing an indication about a resistance of the at least two conductors.

Usually, the test structure comprises test structure sections. Some of the test structure sections may be configured to be accessed by probes, for example by being coupled to pads. Conveniently, distinct test structure sections are isolated from each other during a probe-based test of said sections. Said isolation facilitates an accurate measurement of the test structure (section) resistance.

In order to simplify the provision of the signal to the test structure sections they are connected to each other, by a conductor, to the signal source. Said connection is done during preliminary step 208, that may be preceded by step 204 of performing a probe-based test of at least some of the test structure sections. Step 204 may include measuring the resistance of a test structure section.

Step 208 may be simplified by defining relatively large conductive zones, such as zones 42 and 44. Said zones allow the implementation of simple and relatively inaccurate placement schemes for placing the conductors. The accuracy of said placement may be predefined. Typical accuracy values may be several microns, several millimeters and the like depending on the size of the test structure and the available space. It is important that the added conductors not obscure particularly test structures know to be defective, in order to facilitate voltage contrast localization.

Figure 7:
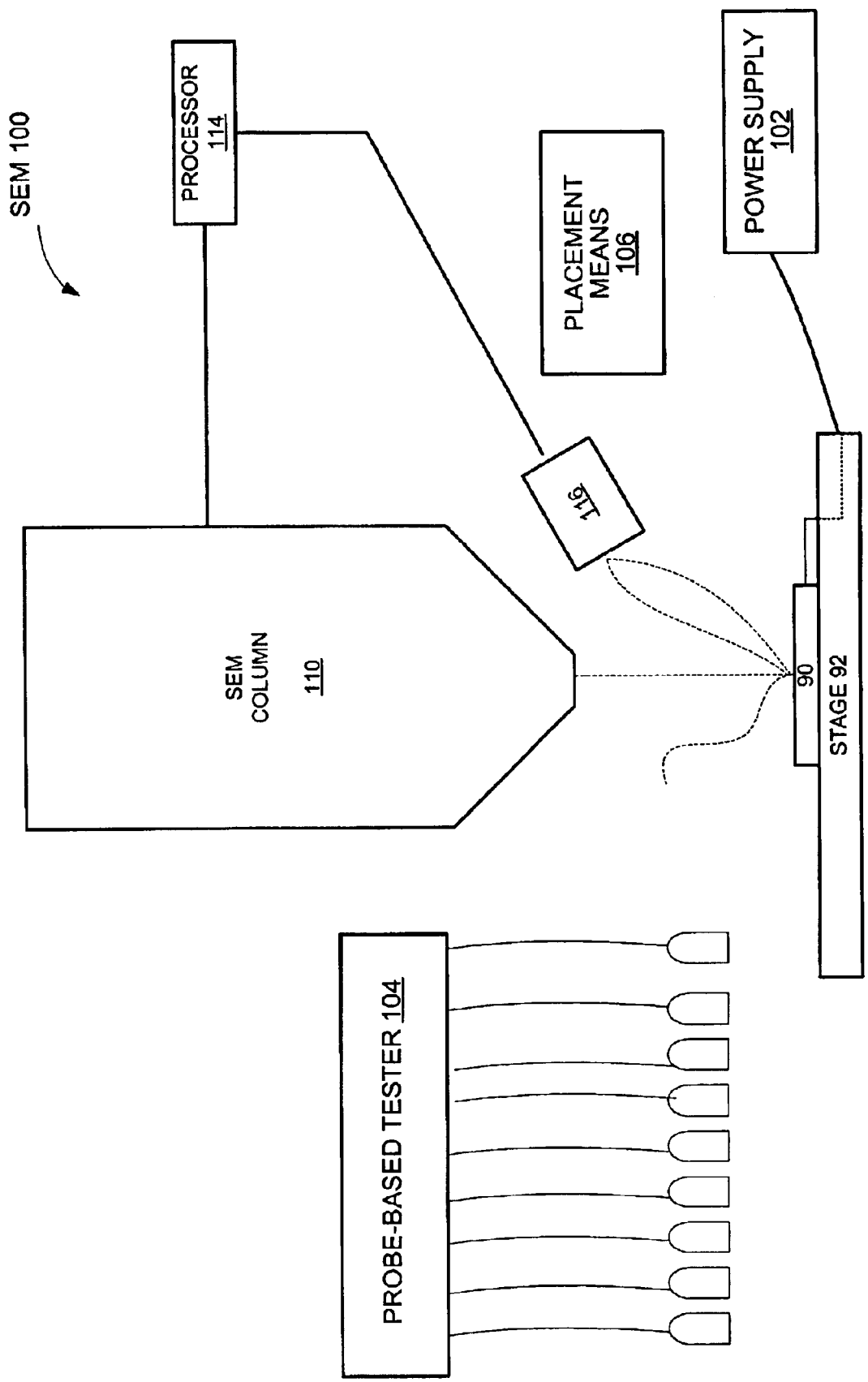
FIG. 7 is a schematic illustration of a system, in accordance to an aspect of the invention.

FIG. 7 is a schematic illustration of an apparatus according to an embodiment of the invention including wafer 90, limited voltage resolution SEM 100, power supply 102, optional probe-based tester 104 and placement means 106. Wafer 90 is positioned over stage 92 such that it may be accessed by limited voltage resolution SEM 100 and may be electrically connected to power supply 102 regardless of the stage 92 travel. Wafer 90 may be shifted from a first location in which it may be accessed by the probe-based tester 104 to another location in which it is accessed by limited voltage resolution SEM 100. Said shift may be implemented by various stages, mechanical arms and the like, conveniently while maintaining predefined environmental related criteria such as low particle and contamination levels in the vacuum chamber (not shown) of the SEM 100. According to an aspect of the invention the placement may be made in a "dirty" environment, and even manually, and the wafer is cleaned by various cleaning means, such as laser based cleaning means, prior to moving the stage of the limited voltage resolution SEM 100. Limited voltage resolution SEM 100 includes SEM column 110, detector 116 and processor 114.

According to various aspects of the invention said entities are located within the same vacuum chamber, but this is not necessarily so. In many cases the placement means 106 can be located outside the vacuum chamber.

The indication about the resistance may include determining the ratio between the resistances of conductors that form a test structure chain or even providing an estimate of their resistance. The latter estimation requires a determination of the overall resistance. A defective conductor can be located by deviation between its resistance and the resistance of other conductors, to an average resistance value or to an expected resistance values range.

It is noted that method 200 may be followed by a step of removing the resistor chain or conductors that couple the test structure sections to each other. This may facilitate a fabrication of another layer or layers and then a repetition of the steps of method 200.

It will also be appreciated that many more different structures and patterns are possible, all coming within the scope of the invention, as defined in the claims to follow.

What is claimed is:

1. A method for testing a resistance of conductors, the method comprising:
providing to a test structure a signal that is substantially larger than a signal threshold;
scanning at least two conductors of the test structure, by a limited voltage resolution SEM, said at least two conductors are electrically coupled to each other, and collecting charged particles emitted from the at least two conductors as a result of the scanning, thus providing an indication about a resistance of the at least two conductors.

2. The method of claim 1 wherein the signal threshold exceeds $10^{-6}$ Volts.

3. The method of claim 1 wherein the signal threshold exceeds $10^{-3}$ Volts.

4. The method of claim 1 wherein the signal threshold exceeds $10^{-7}$ Amperes.

5. The method of claim 1 wherein the signal threshold exceeds $10^{-4}$ Amperes.

6. The method of claim 1 wherein the signal is selected to provide an indication about a resistance of the at least two conductors that is characterized by a resolution that does not exceed ten thousand Ohm.

7. The method of claim 1 wherein the signal is selected to provide an indication about a resistance of the at least two conductors that is characterized by a resolution that does not exceed ten thousand Ohm.

8. The method of claim 1 wherein the signal is selected to provide an indication about a resistance of the at least two conductors that is characterized by a resolution that does not exceed one hundred thousand Ohm.

9. The method of claim 1 wherein the signal is selected to provide an indication about a resistance of the at least two conductors that is characterized by a resolution that does not exceed five hundred thousand Ohm.

10. The method of claim 1 wherein the signal threshold is substantially larger than a voltage induced on the test structure by a charged particle beam of a scanning electron microscope.

11. The method of claim 1 wherein providing a signal to the test structure comprises coupling the test structure to a current source.

12. The method of claim 1 wherein providing a signal to the test structure comprises coupling the test structure to a voltage source.

13. The method of claim 1 wherein the test structure comprises test structure sections, whereas at least some of the test structure sections are configured to be accessed by probes.

14. The method of claim 13 wherein the test structure sections that are configured to be accessed by probes are isolated from each other during a probe-based test of said sections.

15. The method of claim 14 wherein providing a signal to the test structure is preceded by a step of electrically coupling the isolated test structure sections.

16. The method of claim 15 wherein electrically coupling comprises placing conductors upon the isolated test structure sections.

17. The method of claim 16 wherein the isolated test structure sections are shaped to allow placement of conductors, said placement is characterized by an accuracy that is not greater than $5*10^{-6}$ Meter.

18. The method of claim 16 wherein the isolated test structure sections are shaped to allow placement of conductors, said placement is characterized by an accuracy that is not greater than $5*10^{-3}$ Meter.

19. The method of claim 15 wherein the step of electrically coupling comprises a preliminary step of fabricating conductive pads on the test structure that are positioned in proximity to the isolated test structure sections; and wherein the preliminary step is followed by a step of coupling the isolated test structures to the pads by depositing conductive material to electrically connect the isolated test structures and the pads.

20. The method of claim 19 whereas the depositing involves directing a focused ion beam towards a gap defined by the pads and the isolated test structures.

21. The method of claim 1 wherein the test structure comprises test structure sections and wherein at least some test structure sections are electrically coupled to conductors that define at least one coupling zone.

22. The method of claim 21 wherein providing a signal to the test structure is preceded by a step of coupling at least some of the conductors of the at least one coupling zone to a voltage or current source.

23. The method of claim 1 wherein the test structure comprises test structure sections and wherein at least some of the test structure sections include pads that are sized to facilitate access by probes.

24. The method of claim 23 wherein each pad is electrically coupled on one side to the test structure sections and on other side is electrically coupled to conductors that form at least one coupling zone.

25. The method of claim 1 wherein the test structure comprises test structure sections and wherein at least some test structure sections are coupled in parallel to a voltage source.

26. The method of claim 25 wherein providing an indication about a resistance of the at least two conductors comprises comparing voltages over each conductor of the test structure sections.

27. The method of claim 25 further comprising a preliminary step of measuring an overall resistance of the test structure section by probes.

28. The method of claim 1 comprising a step of determining a voltage over serially coupled conductors.

29. The method of claim 28, wherein the serially coupled conductors form a test structure section, wherein providing an indication about a resistance of the at least two conductors comprises comparing voltages over each conductor of the test structure section.

30. The method of claim 29 further comprising a preliminary step of measuring a resistance of the test structure section by probes.

31. The method of claim 1 wherein the limited voltage resolution SEM is characterized by a voltage resolution that is greater than 0.1 Volts.

32. The method of claim 1 wherein the limited voltage resolution SEM is characterized by a voltage resolution that is greater than 0.5 Volts.

33. The method of claim 1 wherein the limited voltage resolution SEM is characterized by a voltage resolution that is greater than 1 Volts.

34. The method of claim 1 wherein the limited voltage resolution SEM is configured to operate in a clean room environment.

35. The method of claim 1 whereas the signal alternates.

36. The method of claim 35 whereas the at least two conductors are scanned at least twice.

37. The method of claim 36 whereas the indication about the resistance is responsive to a relationship between collected charged particles from each scan.

38. The method of claim 1 further comprising determining a location of a defect based on the indication of a resistance of the at least two conductors.

39. Apparatus for testing a resistance of conductors, the apparatus comprising:
    a signal source that provides a signal that is substantially larger than a signal threshold to a test structure; and
    a limited voltage resolution scanning electron microscope, adapted to
    (i) scan at least two conductors of the test structure, said at least two conductors are electrically coupled to each other;
    (ii) collect charged particles emitted from the at least two conductors as a result of the scanning; and
    (iii) provide an indication about a resistance of the at least two conductors.

40. The apparatus of claim 39 wherein the signal threshold exceeds $10^{-6}$ Volts.

41. The apparatus of claim 39 wherein the signal threshold exceeds $10^{-3}$ Volts.

42. The apparatus of claim 39 wherein the signal threshold exceeds $10_{-7}$ Amperes.

43. The apparatus of claim 39 wherein the signal threshold exceeds $10^{-4}$ Amperes.

44. The apparatus of claim 39 wherein the signal is selected to provide an indication about a resistance of the at least two conductors that is characterized by a resolution that does not exceed one thousand Ohm.

45. The apparatus of claim 39 wherein the signal is selected to provide an indication about a resistance of the at least two conductors that is characterized by a resolution that does not exceed ten thousand Ohm.

46. The apparatus of claim 39 wherein the signal threshold is substantially larger than a voltage induced on the test structure by a charged particle beam of a scanning electron microscope.

47. The apparatus of claim 39 wherein the signal source is a current source.

48. The apparatus of claim 39 wherein the signal source is a voltage source.

49. The apparatus of claim 39 wherein the test structure comprises test structure sections, whereas at least some of the test structure sections are configured to be accessed by probes.

50. The apparatus of claim 49 wherein the test structure sections that are configured to be accessed by probes are isolated from each other during a probe-based test of said sections.

51. The apparatus of claim 50 wherein the apparatus further comprises placement means for electrically coupling the isolated test structure sections to each other.

52. The apparatus of claim 51 wherein the placement means is operable to place conductors upon the isolated test structure sections.

53. The apparatus of claim 52 wherein the isolated test structure sections are shaped to allow placement of conductors, said placement is characterized by an accuracy that is not greater than $5*10^{-6}$ Meter.

54. The apparatus of claim 53, wherein at least some test structure sections are electrically connected to conductors that define at least one coupling zone, and wherein the placement means is operable to couple at least some of the conductors of the at least one coupling zone to the signal source.

55. The apparatus of claim 53 wherein at least some of the test structure sections include pads that are sized to facilitate access by the probes.

56. The apparatus of claim 52 wherein the isolated test structure sections are shaped to allow placement of conductors, said placement is characterized by an accuracy that is not greater than $5*10^{-3}$ Meter.

57. The apparatus of claim 51 wherein the placement means is operable to couple isolated test structures to conductive pads by depositing a conductive material to electrically connect the isolated test structures and the pads.

58. The apparatus of claim 57 wherein the conductive material is deposited over a gap defined by the pads, wherein the pads are positioned in proximity to the isolated test structure sections.

59. The apparatus of claim 57 wherein the placement means are operable to deposit the conductive material by directing a focused ion beam towards a gap defined by pads and the isolated test structures.

60. The apparatus of claim 39 wherein the test structure comprises test structure sections and wherein at least some test structure sections are electrically coupled to conductors that define at least one coupling zone.

61. The apparatus of claim 39 wherein the test structure comprises test structure sections and wherein at least some test structure sections are coupled in parallel to a voltage source.

62. The apparatus of claim 61 wherein the limited voltage resolution scanning electron microscope is operable to provide an indication about a resistance of the at least two conductors in response to a comparison between voltages over each conductor of the test structure sections.

63. The apparatus of claim 62 wherein the apparatus further comprising a probe-based tester.

64. The apparatus of claim 63 wherein probe-based tester is operable to measure an overall resistance of the test structure section by probes.

65. The apparatus of claim 39 wherein the limited voltage resolution scanning electron microscope is operable to determine a voltage over serially coupled conductors.

66. The apparatus of claim 39 wherein the limited voltage resolution scanning electron microscope is characterized by a voltage resolution that is greater than 0.1 Volts.

67. The apparatus of claim 39 wherein the limited voltage resolution scanning electron microscope is characterized by a voltage resolution that is greater than 0.5 Volts.

68. The apparatus of claim 39 wherein the limited voltage resolution scanning electron microscope is characterized by a voltage resolution that is greater than 1 Volts.

69. The apparatus of claim 39 wherein the scanning electron microscope is configured to operate in a clean room environment.

70. The apparatus of claim 39 whereas the signal alternates.

71. The apparatus of claim 70 whereas the at least two conductors are scanned at least twice.

72. The apparatus of claim 39 further adapted to determine a location of a defect based on the indication of a resistance of the at least two conductors.

* * * * *